United States Patent
Lai et al.

(10) Patent No.: US 7,898,313 B1
(45) Date of Patent: Mar. 1, 2011

(54) SIGNAL OFFSET CANCELLATION

(75) Inventors: Tin H. Lai, San Jose, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/723,450

(22) Filed: Mar. 12, 2010

Related U.S. Application Data

(60) Division of application No. 12/116,059, filed on May 6, 2008, now Pat. No. 7,710,180, which is a continuation of application No. 11/323,372, filed on Dec. 29, 2005, now Pat. No. 7,368,968.

(51) Int. Cl.
*H03F 3/45* (2006.01)
*H03L 5/00* (2006.01)

(52) U.S. Cl. .......................................... 327/307; 330/9

(58) Field of Classification Search .................. 330/330, 330/258–259, 158, 9; 327/306–307
See application file for complete search history.

(56) References Cited

U.S. PATENT DOCUMENTS 5,631,603 A * 5/1997 Stubbe et al. .................. 330/9

\* cited by examiner

*Primary Examiner*—Dinh T. Le
(74) *Attorney, Agent, or Firm*—Ropes & Gray LLP

(57) ABSTRACT

Techniques and circuitry are provided for programmably controlling signal offsets in integrated circuitry. In one embodiment, an integrated circuit includes a signal offset cancellation circuit that is programmably selected to control the offset of signals on either one input/output or another input/output of an amplifier circuit. In one embodiment, a logic circuit is used to selectively couple a bank of current sources to one input/output or another input/output of a differential amplifier through a switching circuit. The bank of current sources may employed to control the signal offset on either input/output, or may be decoupled from all of the inputs/outputs when signal offset cancellation is not required.

4 Claims, 7 Drawing Sheets

US 7,898,313 B1

SIGNAL OFFSET CANCELLATION

CROSS-REFERENCES TO RELATED APPLICATIONS

The present application is a divisional of U.S. application Ser. No. 12/116,059, filed May 6, 2008, and entitled "Signal Offset Cancellation", which is a continuation of U.S. application Ser. No. 11/323,372, filed Dec. 29, 2005, and entitled "Signal Offset Cancellation", and is herein fully incorporated by reference for all purposes. This application is related to U.S. patent application Ser. No. 11/245,581, filed Oct. 6, 2005, and entitled "Programmable Logic Enabled Dynamic Offset Cancellation" and U.S. patent application Ser. No. 11/323,571, filed Dec. 29, 2005, and entitled "Comparator Offset Cancellation Assisted by PLD Resources," both of which are incorporated by reference herein for all purposes.

BACKGROUND OF THE INVENTION

The present invention relates to techniques for controlling signal offsets, and more particularly, to techniques for correcting signal offsets associated with integrated circuit buffers and amplifiers using programmable resources.

Generally, interface circuitry such as input and output buffer circuits are used to amplify and/or condition signals for detection or transmission. In the case of an input buffer in a telecommunication system, the input buffer circuit receives an input signal that has typically undergone degradation and attenuation as it propagated through a transmission link. The function of the input buffer is therefore to amplify and recondition the received signal, and in some cases to provide frequency equalization, so that the receiver circuitry can properly resolve the incoming bits. In the case of an output buffer, the circuit is typically required to drive an output signal at the appropriate levels for a given transmission link. In either case, any signal offset that may be caused by the buffer circuitry can contribute to operational error. Signal offsets, typically voltage offsets, reduce the available timing margins needed to resolve incoming data bits. This causes an increase in the bit error rate (BER) of the receiver circuit. In the case of output buffers, offsets cause undesirable duty cycle distortion for the output signal.

Various offset cancellation techniques have been developed to eliminate or reduce the adverse effects of signal offsets. For example, in differential circuits, input and output buffer circuits often include selectable current sources coupled to outputs of a differential amplifier circuit. Each current source is typically connected in parallel with a respective transistor output of the transistor pair. Such an arrangement allows the current source and respective transistor to form a voltage divider. The voltage divider is used to adjust a voltage offset with respect to the amount of fixed current being drawn by the current source. Unfortunately, such a conventional arrangement often adds additional unnecessary load to the transistor output when voltage offset is not required. For example, controlling the voltage offset may be unnecessary where the voltage offset may be designed within a tolerance range or part of a given circuit that is unaffected by voltage offsets.

Moreover, as such selectable current sources are generally run parallel to one another, and draw different amounts of fixed current, the amount of change in voltage offset is adjustable by selecting different current sources alone or in parallel to achieve the desired offset voltage amount. Unfortunately, even with precise process control during circuit manufacturing, process variations often introduce differences in the differential circuit components. Such differences often translate into variations in offset signal control with respect to each differential input/output. In addition, the circuitry used to control the current sources and the current sources themselves consumes valuable circuit space on the die.

There is therefore a need for circuits and methods to reduce or eliminate signal offsets when desired in order to improve integrated circuit operational performance while requiring less die space and complexity than conventional signal offset correction circuits.

BRIEF SUMMARY OF THE INVENTION

Embodiments of the present invention pertain to techniques and circuitry to control signal offsets in integrated circuits and systems. Generally, the present invention employs programmable resources to correct for offsets without increasing circuit complexity and loading conditions. The programmability of the offset cancellation technique according to the present invention allows for adjusting the signal offset such that either inputs or outputs of a differential amplifier may employ signal offset correction.

In one embodiment, the present invention provides an integrated circuit having a buffer with an offset cancellation circuit. The offset cancellation circuit includes a bank of parallel current sources that are selectably connected to one output or another output of the differential amplifier portion of the buffer through a switching circuit. The bank of parallel current sources may be programmably controlled to change the signal offset for one output of the differential amplifier or the other, or to be decoupled from either output.

A better understanding of the nature and advantages of the present invention can be gained from the following detailed description and the accompanying drawings.

DETAILED DESCRIPTION OF THE INVENTION

The present invention pertains to correcting signal offsets using programmable resources. Generally, signal offsets may be categorized as DC voltage offsets or as average voltage offsets attributable to AC waveforms. For example, when integrated circuits are DC coupled, signal offsets may be described in terms of a DC voltage offset. When the integrated circuits are AC coupled, the signal offsets may be categorized as a voltage offset due to an averaging of the AC waveform transmitted therebetween. For example, in the case of an AC coupled differential amplifier, the AC offset averages converge to an average common-mode offset voltage.

Signal offsets are caused by variations and mismatches in transistors and other integrated circuit components. For example, a buffer circuit may include a differential amplifier with a differential input pair of transistors. Mismatches in physical and electrical characteristics of the transistors forming the differential input pair can cause signal offsets. The present invention provides various techniques for correcting these types of offsets. While the invention is described herein in the context of various differential input buffers, those skilled in the art will appreciate that the techniques described herein can be applied to single-ended circuits as well as output buffers and any other circuitry that can benefit from offset cancellation.

Figure 1:
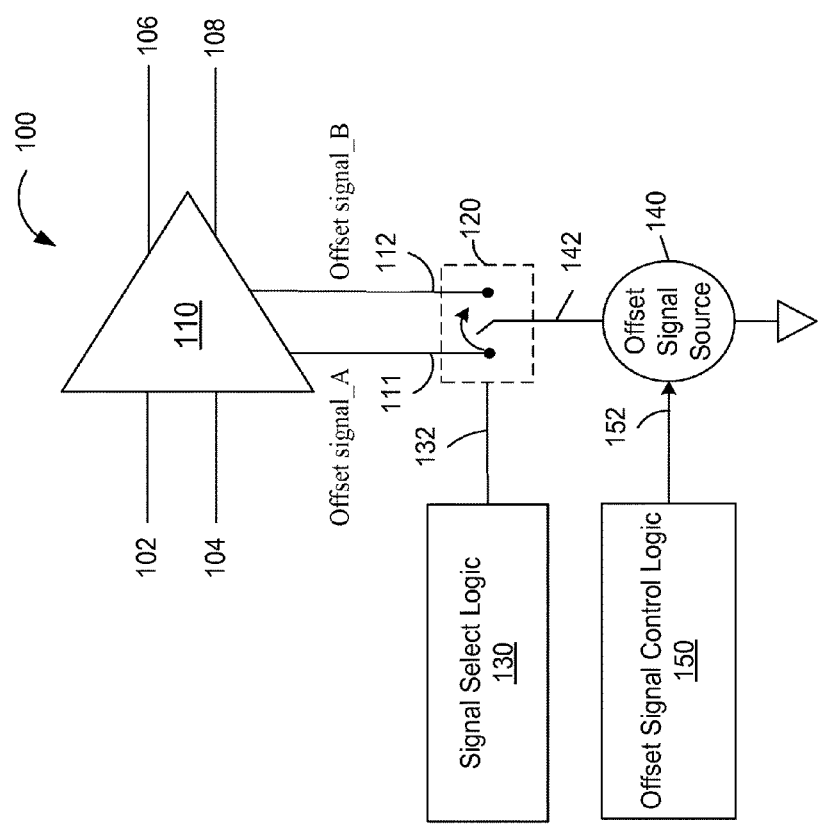
FIG. 1 is a simplified block diagram of one exemplary embodiment of an offset cancellation circuit according to the present invention.

Referring to FIG. 1, there is shown a high level block diagram of an integrated circuit 100 with programmable offset cancellation according to one exemplary embodiment of the present invention. Integrated circuit 100 includes an input buffer 110, switch 120, and programmable resources such as signal select logic 130 and offset signal control logic 150. In one embodiment, input buffer 110 receives a differential input signal at input 102 and input 104. Input buffer 110 amplifies the input signal and couples it to, for example, another buffer amplifier, driver circuit, receiver block, and the like, via outputs 106 and 108, examples of which are described below. Input buffer 110 includes offset signal_A input 111 and an offset signal_B input 112. During operation of integrated circuit 100, either offset signal_A input 111 or offset signal_B input 112 is used to control the offset of buffer 110.

In one configuration, a programmable offset signal source 140 generates an offset signal 142 (e.g., a voltage and/or a current signal) in response to, for example, an offset cancellation algorithm. Offset signal 142 is coupled through switch 120 to 110 at either offset signal_A input 111 or offset signal_B input 112. In one configuration, in response to a select signal 132, switch 120 decouples offset signal 142 from buffer 110. Switch 120 may be any type of switch capable of coupling and decoupling offset signal 142 from buffer 110.

In one embodiment, integrated circuit 100 includes signal select logic 130. Based on a desired logic setting from, for example, a Programmable Logic Device (PLD), signal select logic 130 generates select signal 132 which is coupled to switch 120 for control thereof. Signal select logic 130 can be configured using a variety of methods to select which differential node in buffer 110 receives offset signal 142 (e.g., offset signal_A input 111 or offset signal_B input 112). One method, for example, utilizes a calibration process which first applies offset signal 142 to either offset signal_A input 111 or offset signal_B input 112 to buffer 110. The offset at the output of buffer 110 is then measured to determine which output 106 or 108 to adjust. The calibration process also measures the amount of offset which indicates the magnitude of offset signal 142 required to correct for the offset. Advantageously, signal select logic 130 allows the user to perform this calibration process under system control, for example, whenever there is no data traffic, as needed. A similar process can be performed if input data is AC coupled. For AC coupled inputs, when there is no toggling of the signal, the DC level converges to the common mode level allowing offsets to be measured by detecting the switching point for signal transition at an output of a receiver block, for example.

Offset signal 142 may include a current signal, a voltage signal, or digital data signal configured to directly or indirectly adjust the level of offset of signals on outputs 106 and 108. For example, offset signal 142 may be a current signal generated by a current source version of offset signal source 140, embodiments of which are described below. Such a current signal may be adjusted in magnitude to control the signal offset present on either output 106 or output 108 during circuit operation as described below with respect to FIG. 2 in order to, for example, correct the signal offset. In another embodiment, offset signal 142 may be used to indirectly control the amount of voltage and/or current offset of buffer 110. For example, it is contemplated that buffer 110 may be configured such that offset signal_A input 111 and offset signal_B input 112 are responsive to digital signals. In this embodiment, offset signal 142 may be a digital word digitally controlling an offset of buffer 110.

In one embodiment, offset signal source 140 generates offset signal 142 in response to offset control signal 152. Offset control signal 152 may be generated from offset signal control logic 150, or may be supplied externally, from for example, and external signal input. Signal control logic 150 is configured to programmably control the magnitude of the offset signal 142 provided by offset signal source 140. In one embodiment, offset control signal 152 may be used to directly or indirectly control the magnitude of offset signal 142 supplied to switch 120. For example, offset control signal 152 may be a current control signal capable of adjusting the magnitude of a current signal or voltage signal of offset signal 142. In one embodiment, to minimize possible noise bleed though and/or extraneous power consumption, signal offset source 140 may be disabled when offset signal 142 is not needed.

Advantageously, to provide system flexibility signal control logic 150 may be preset to control the magnitude of offset signal 142. For example, for a given system that requires a voltage offset within a predetermined tolerance, signal control logic 150 may be preset to adjust offset signal 142 which adjusts the voltage offset of buffer 110 to within the desired tolerance limits. Thus, the provision of signal select logic 130 and signal control logic 150 simplifies the front-end circuitry for offset cancellation and allows the user to develop an offset cancellation algorithm that cancels offsets based on the needs of a given application.

Figure 2:
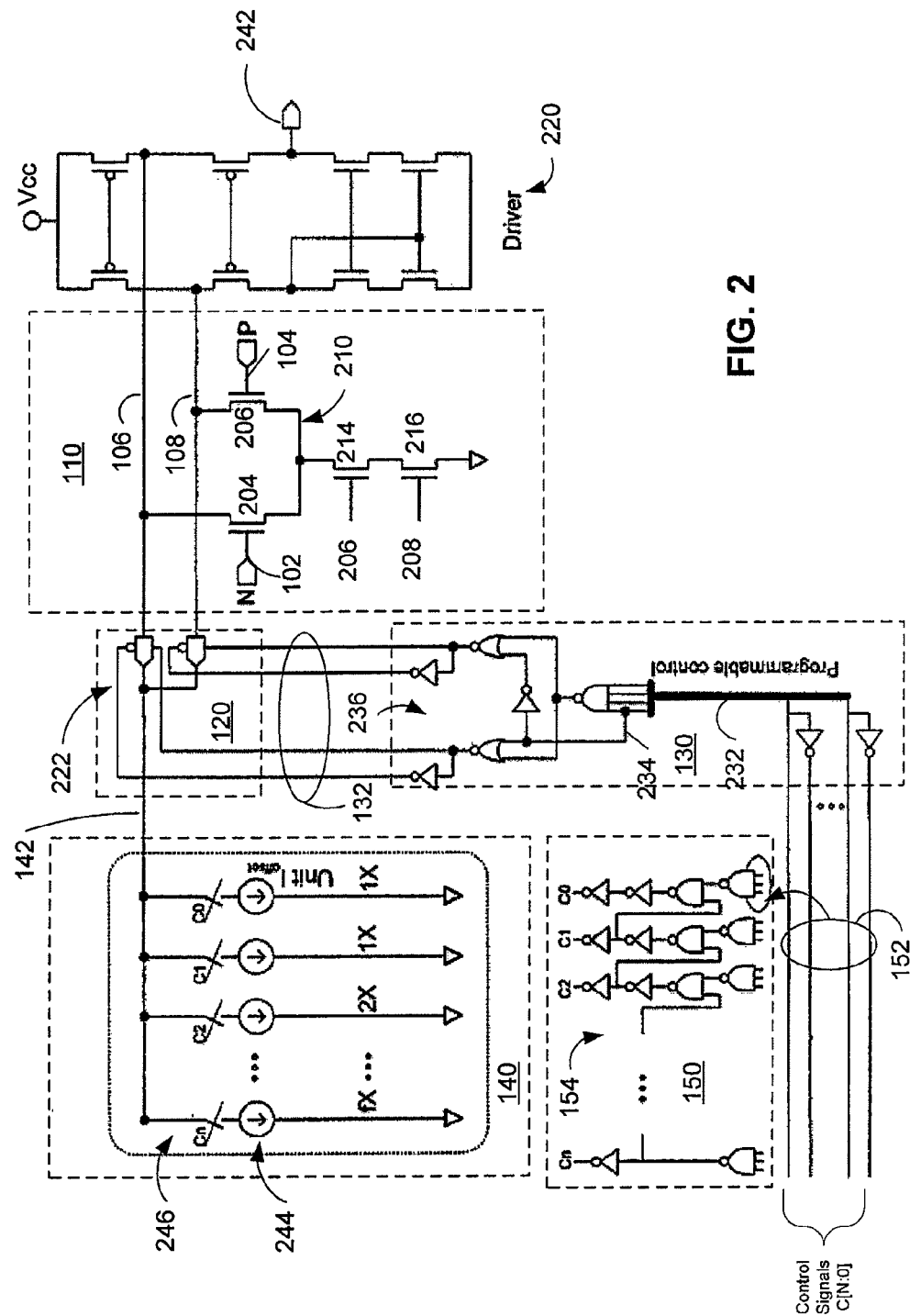
FIG. 2 is a simplified circuit diagram of a buffer with offset cancellation circuitry according to an exemplary embodiment of the present invention.

FIG. 2 is a simplified circuit diagram of one exemplary embodiment of integrated circuit 100 of FIG. 1. In this embodiment, buffer 110 includes a differential transistor pair 210 made up of a pair of input transistors 204 and 206. The gate terminals of input transistors 204 and 206 are coupled to inputs 104 and 106, respectively. Outputs 106 and 108 are respectively coupled to the drain terminals of input transistors 204 and 206. The source of each transistor 204 and 206 couples to a common-source node. Optional transistors 214 and 216 may be coupled in series to the common-source node and controlled via control signals 206 and 208, respectively, to enable and disable, and control the overall current flow through transistor pair 210.

In one embodiment, differential transistor pair 210 may be coupled to a driver circuit 220 via outputs 106 and 108. Driver circuit 220 may be a common mode driver as illustrated, converting outputs 106 and 108 into a common mode output signal 242. In one embodiment, when a voltage offset is present in such a differential transistor pair 210, for zero input differential voltage applied to inputs 104 and 106, there will be a non-zero output voltage either in the negative direction or the positive direction, e.g., common mode output signal 242 will be non-zero.

In one embodiment, switch 120 may include switches 222 capable of programmably coupling either output 106 or output 108 to offset signal 142. For example, switches 222 may be transistor pass-gates, or transmission gates, capable of coupling offset signal 142 to either output 106 or output 108. Switches 222 may be formed as part of a PLD circuit. Switches 222 may be programmably controlled via enable terminals responsive to, for example, select logic signal 132.

If an offset correction is needed, switch 120 may be controlled via select signal 132 to couple either output 106 or output 108 through switches 222 to offset signal 142. If offset correction is not needed, switch 120 is controlled via select signal 132 to decouple output 106 and output 108 from offset signal 142.

During operation, signal select logic 130 may generate select signal 132 in response to internal or external signals. For example, in one embodiment signal select logic 130 may generate select signal 132 in response to offset control signal 152. For example, select signal 132 may be derived from an offset control signal 152 having, for example, a M-bit word A[N:0] 232, where N is a one or more, that controls offset signal source 140. In this embodiment, signal select logic 130 may include combinatorial logic 236 that employs a most-significant-bit (MSB) 234 of M-bit word 232 to select which output 106 or 108, if any, is coupled to offset signal 142. This is advantageous, as switch control signal 132 may be derived from the same M-bit word 232 used to control offset signal source 140, thereby saving logic resources.

In one embodiment, offset signal source 140 includes a bank of offset current sources 244 coupled in parallel and coupled to switch 120 via current select switches 246. The bank of offset current sources 244 would typically be implemented by n-channel (or p-channel) transistors whose gates are connect to a bias voltage. The bank of offset current sources 244 may be selected in any combination to program a plurality of current levels as needed. For example, the bank of offset current sources 244 may be multiples of a desired current increment $I_{offset}$. As illustrated, current sources 244 may be configured as 1×, 2×, 3×, ... f× times the current increment $I_{offset}$, where f represents a plurality of multipliers. Advantageously, offset current sources 244 may be preset to control the current value of offset signal 142 for a number of given applications.

In order to connect one or more individual current sources 244 to switch 120, current select switches 246 may be formed from a series of pass-gates controlled by internal and/or external signals. For example, signal control logic 150 may employ a digital word such as digital word C[0:N] to select which current sources 244 are to be used for a given offset signal 142. In one example, signal control logic 150 may include combinatorial logic 154 capable of generating control signals C[0:N] in response to M-bit word 232.

Figure 3:
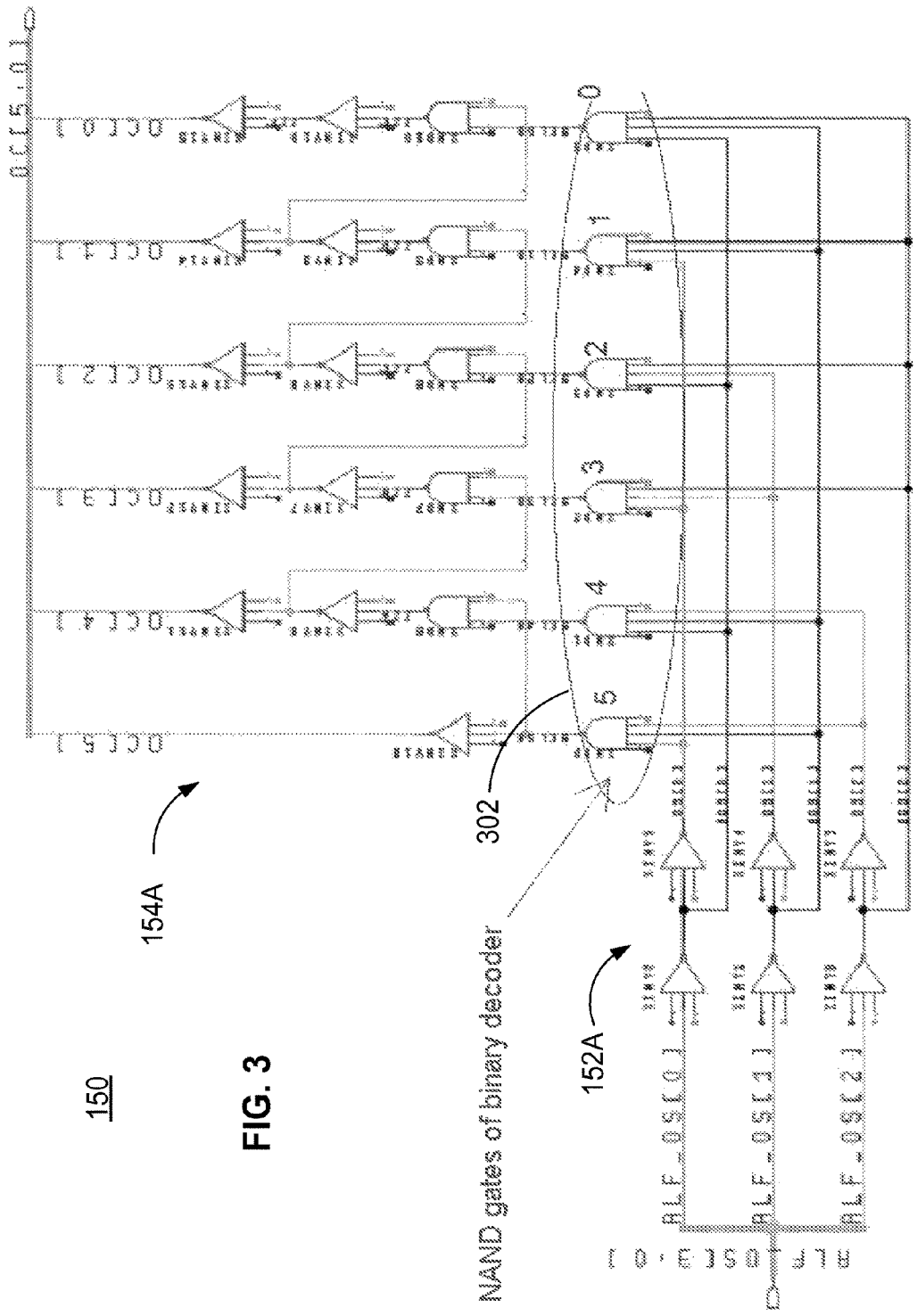
FIG. 3 is a simplified circuit diagram of a carry chain circuit according to an exemplary embodiment of the present invention.

In one embodiment, when offset correction is required on either output 106 or output 108, combinatorial logic 154 may be configured to minimize the number offset current sources 244 needed to generate the desired offset cancellation signal. FIG. 3, illustrates one embodiment of combinatorial logic 154A capable of generating control signals OC[5:0] in response to 3-bit word 232A. In this illustration, 3-bit word 232A is provided by a three-bit binary bus RLF_OS[2:0] coupled to NAND gates 302. Table one illustrates the sequence of which NAND-gate zero though NAND-gate one is selected upon a binary input value. As illustrated in table one, each NAND gate, zero though five, when selected, will select a corresponding output signal OC[0], OC[1], OC[2], OC[3], OC[4], OC[5]. These output signals OC[5:0] may be used to enable the 1×, 2×, 3×, etc. offset cancellation current sources 244.

TABLE 1

| RLF_OS[2] | RLS_OS[1] | RLF_OS[0] | Selected |
| --- | --- | --- | --- |
| 0 | 0 | 0 | NANDgate 0 |
| 0 | 0 | 1 | NANDgate 1 |
| 0 | 1 | 0 | NANDgate 2 |
| 0 | 1 | 1 | NANDgate 3 |
| 1 | 0 | 0 | NANDgate 4 |
| 1 | 0 | 1 | NANDgate 5 |

In one embodiment, combinatorial logic 154A forms a carry chain 302 to allow such a digital word to control more than one current source 244. For example, when RLF_OS[2:0] is digital word 000, NAND-gate 0 is selected and therefore OC[0] is selected. When RLF_OS[2:0] is digital word 001, NAND-gate one is selected and NANDgate zero is not selected. However, through carry chain 302 NAND-gate one selects OC[0]. In this case current sources controlled by OC[0] and OC[1] are selected. Similarly, when RLF_OS[2:0] is digital word 010, through carry chain 302 control signals OC[2], OC[1], OC[0] are selected thereby selecting current sources controlled by OC[2], OC[1], OC[0]. In other words, carry chain 302 enables control signals OC[n], OC[n−1], OC[n−2], . . . , OC[1], OC[0] where the binary input value equals n.

Figure 4:
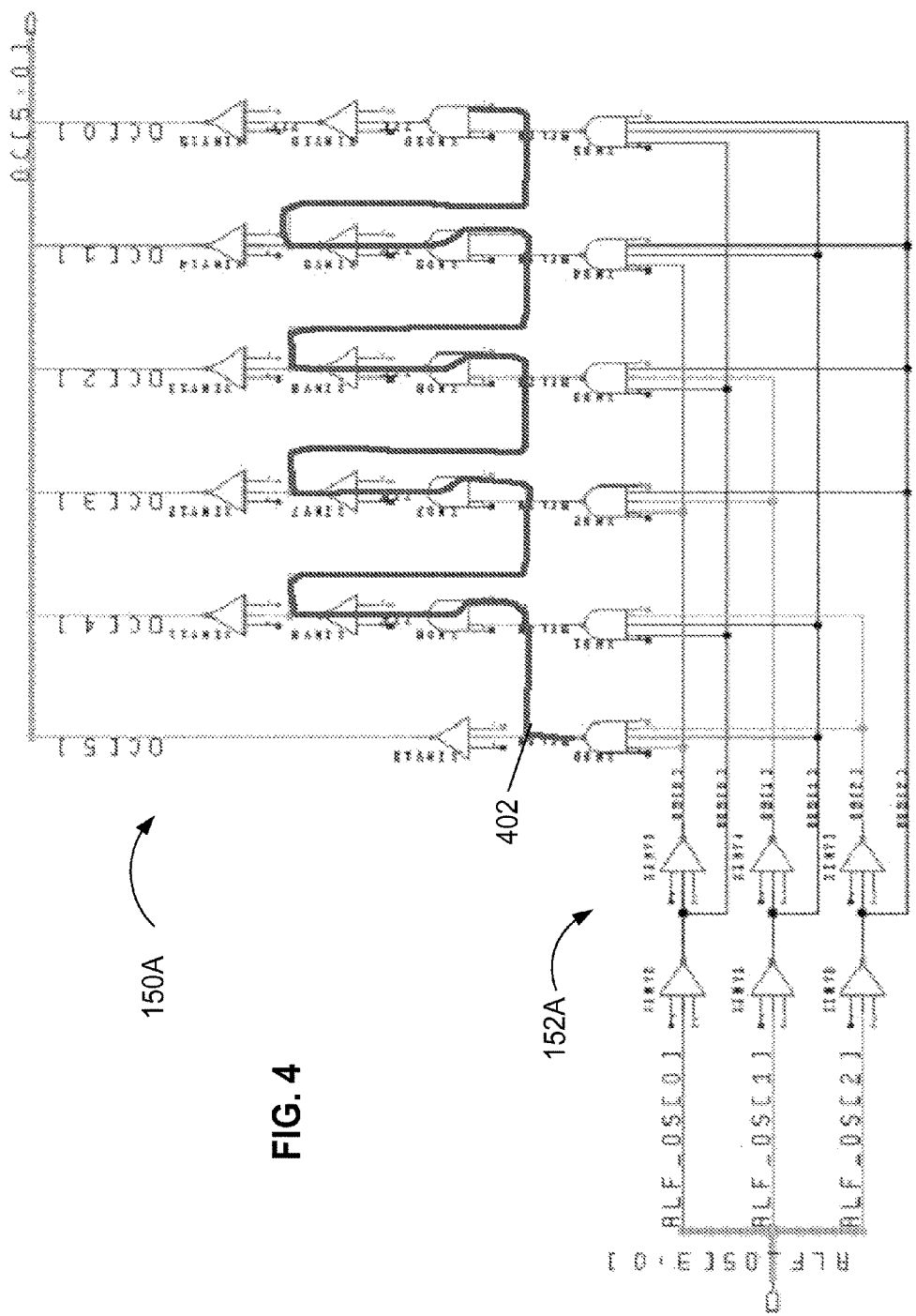
FIG. 4 is a simplified circuit diagram of a carry chain circuit and the carry chain path according to an exemplary embodiment of the present invention.

FIG. 4 illustrates a path 402 of carry chain 302 of FIG. 3, which allows the deployment of available current sources 244 to maximize the amount of offset cancellation, while reducing the number of current sources and logic typically needed in conventional signal offset cancellation circuitry. In one embodiment, carry chain 302 may be used to reduce the number of current sources 244 required for a given offset cancellation requirement. For example, consider the case where for a current offset value of 1×, 2×, 4×, or 8× an $I_{offset}$ value, a conventional direct binary decoding circuit would require 1+2+4+8=15 number of current sources. Using the carry chain process of the present invention the total number of current sources 244 would be 1+1+2+4=8. Table two illustrates one embodiment of a process using such a carry chain 302.

TABLE 2

| Binary Input Value | Carry Chain Process |
| --- | --- |
| n = 0 | select 1X |
| n = 1 | select new 1X and previous 1X to obtain 2X select new 2X |
| n = 2 | and previous 1X + 1X to obtain 4X |
| n = 3 | select new 4X and previous 1X + 1X + 2X to obtain 8X |

In this illustration, for a 3-bit digital word, using carry chain 302 of the present invention, for a digital word value of zero, one current source 244 is selected. For a digital word value of one, the carry chain selects a 1× current source 244 and another 1× current source 244. For a digital word value of two, the carry chain process selects the 1× current source 244, the other 1× current source 244, and a 2× current source 244. For a digital word value of three, the carry chain process selects the 1× current source 244, the other 1× current source 244, the 2× current source 244, and a 4× current source 244.

While the various programmable logic enabled offset cancellation techniques described herein can be employed in any type of integrated circuit or system, they are particularly well suited for programmable logic devices (PLDs) or field programmable gate arrays (FPGAs). This is so because PLDs and FPGAs provide powerful programmability that can very efficiently implement different aspects of the present invention by any optimized combination of hardware and software. For example, the entire integrated circuit 100, or portion thereof, shown in FIG. 1, can be implemented by a complex PLD wherein the integrated circuit 100 may include any one of a number of typical transceiver circuits such as clock data recovery (CDR), switches, dynamic phase adjustment (DPA), serializer-deserializer, phase locked loop or delay locked loop circuitry and the like including clock networks. These circuit blocks may be implemented by hardwired circuitry while signal select logic 130 and signal control logic 150 is contained in the programmable core of the PLD. Such an implementation allows the user to create an offset cancellation algorithm that may be invoked by the system upon power-up, reset or initialization, during system idle time or when low bit error rate is detected in a given channel.

The PLD implementation allows the system or the user to customize the offset cancellation scheme for the needs of the particular application. For example, in telecommunication applications, for channels that run at a lower data rate, the invention allows saving area and power by not enabling offset cancellation altogether. The present invention also provides for technology migrations from one generation to the next easier since it eliminates the need to design a custom signal offset circuit for each PLD design. The invention can be further extended to the entire link wherein not only the offset of the receiver can be cancelled, but offsets associated with the physical layer and transmitter can be cancelled when both ends of the link are under the control of the PLD user.

Figure 5:
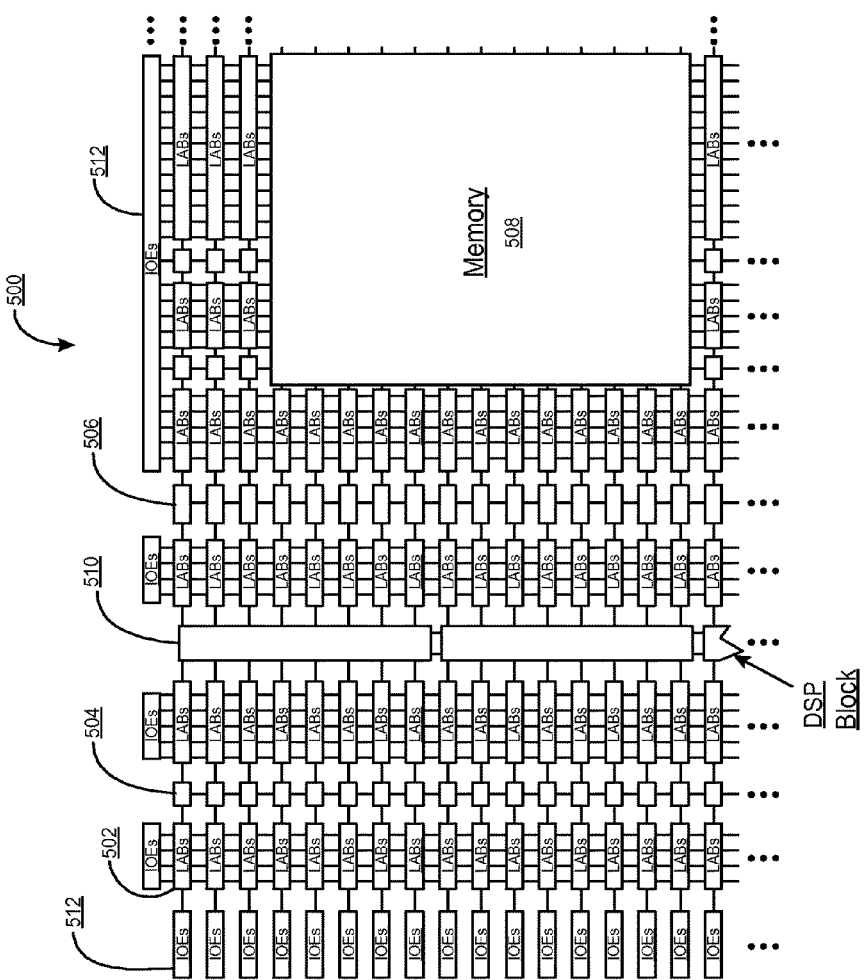
FIG. 5 is a simplified block diagram of a programmable logic device that can embody the techniques of the present invention.

FIG. 5 is a simplified partial block diagram of one example of PLD 500 that can implement aspects of the present invention. It should be understood that the present invention can be applied to numerous types of integrated circuits including programmable logic integrated circuits, field programmable gate arrays, mask FPGAs, and application specific integrated circuits (ASICs) or application specific standard products (ASSPs) that provide programmable resources. Referring to FIG. 5, PLD 500 includes a two-dimensional array of programmable logic array blocks (or LABs) 502 that are interconnected by a network of column and row interconnects of varying length and speed. LABs 502 include multiple (e.g., 10) logic elements (or LEs).

An LE is a programmable logic block that provides for efficient implementation of user defined logic functions. A PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 500 also includes a distributed memory structure including RAM blocks of varying sizes provided throughout the array. The RAM blocks include, for example, 512 bit blocks 504, 4K blocks 506, and a block 508 providing 512 K bits of RAM. These memory blocks can also include shift registers and FIFO buffers.

PLD 500 further includes digital signal processing (DSP) blocks 510 that can implement, for example, multipliers with add or subtract features. I/O elements (IOEs) 512 located, in this example, around the periphery of the device support numerous single-ended and differential I/O standards. These I/O elements 512 may include differential input or output buffers with offset cancellation circuitry of the type shown in FIGS. 1-5. PLD 500 can additionally provide transceiver functionality for telecommunication applications. In the exemplary embodiment shown in FIG. 5, PLD 500 includes one or more transceiver blocks 520. Transceiver blocks 520 may include integrated circuit 100 of FIG. 1 and may implement offset cancellation techniques as described herein. It is to be understood that PLD 500 is described herein for illustrative purposes only and that the present invention can be implemented in many different types of PLDs, FPGAs, and the like.

Figure 6:
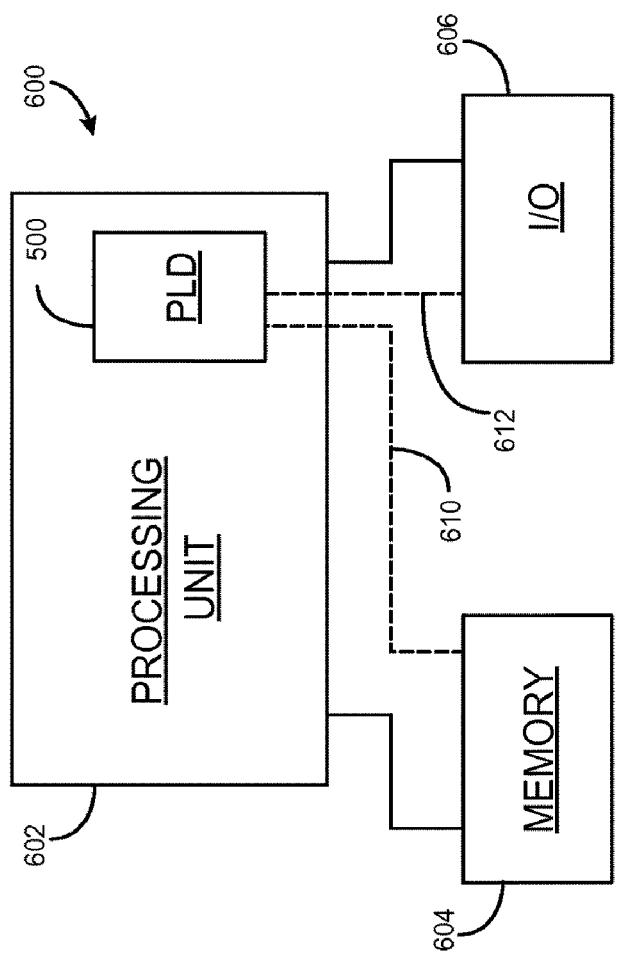
FIG. 6 is simplified a block diagram of an electronic system that can implement embodiments of the present invention.

While PLDs of the type shown in FIG. 5 provide many of the resources required to implement system level solutions, the present invention can also benefit systems wherein a PLD is one of several components. FIG. 6 shows a block diagram of an exemplary digital system 600, within which the present invention can be embodied. System 600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 600 can be provided on a single board, on multiple boards, or within multiple enclosures.

System 600 includes a processing unit 602, a memory unit 604 and an I/O unit 606 interconnected together by one or more buses. According to this exemplary embodiment, a PLD 500 is embedded in processing unit 602. PLD 500 can serve many different purposes within the system in FIG. 6. PLD 500 can, for example, be a logical building block of processing unit 602, supporting its internal and external operations. PLD 500 is programmed to implement the logical functions necessary to carry on its particular role in system operation. PLD 500 can be specially coupled to memory 604 through connection 610 and to I/O unit 606 through connection 612.

Processing unit 602 can direct data to an appropriate system component for processing or storage, execute a program stored in memory 604 or receive and transmit data via I/O unit 606, or other similar function. Processing unit 602 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 500 can control the logical operations of the system. In an embodiment, PLD 500 acts as a reconfigurable processor, which can be reprogrammed as needed to handle a particular computing task. Alternately, programmable logic device 500 can itself include an embedded microprocessor. Memory unit 604 can be a random access memory (RAM), read only memory (ROM), fixed or flexible disk media, PC Card flash disk memory, tape, or any other storage means, or any combination of these storage means.

Figure 7:
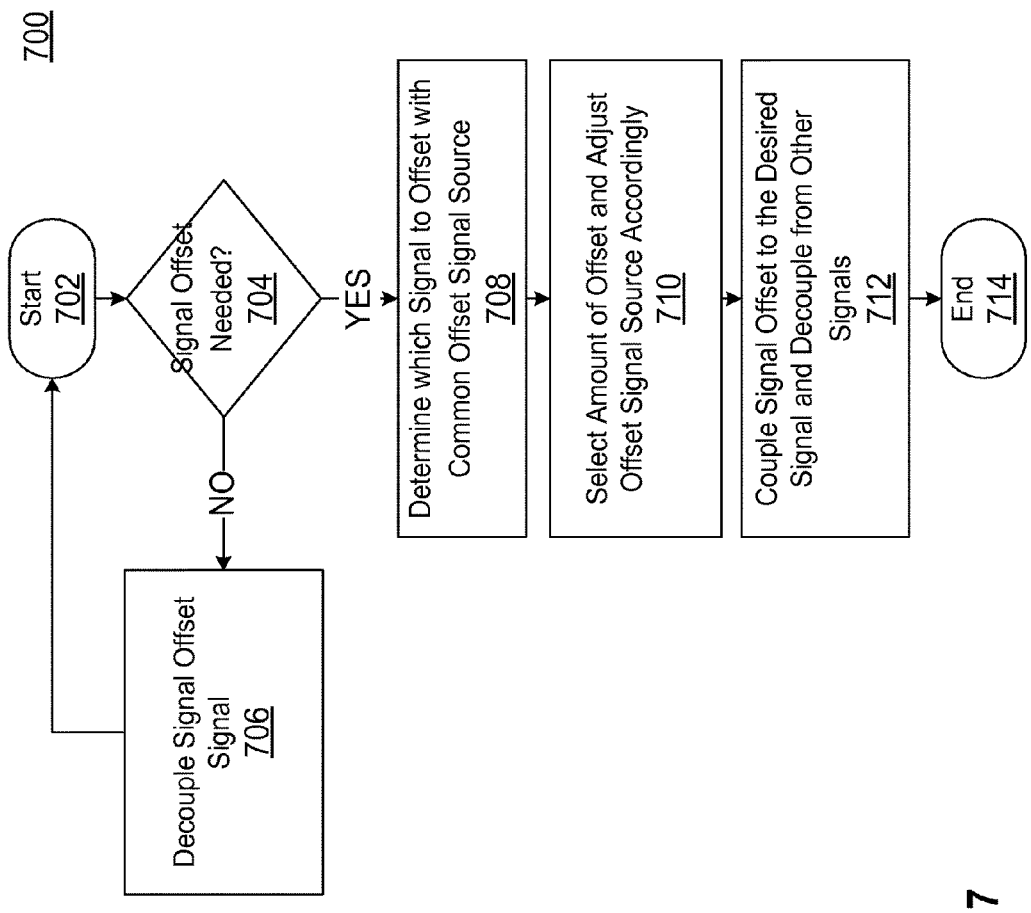
FIG. 7 is a flow diagram for a method of correcting signal offsets according to an exemplary embodiment of the present invention.

FIG. 7 is a flow diagram of a method 700 of canceling signal offsets according to one embodiment of the present invention. Method 700 starts at step 702, when for example, integrated circuit 100 is employed to cancel signal offsets in a given transmission link. At step 704, a determination is made whether or not offset cancellation is required. If there is no requirement for offset cancellation, then at step 706, the offset signal is decoupled from all of the signals inputs/outputs. For example, switch 120 decouples offset signal source 140 and offset signal 142 from buffer 110. This is advantageous as conventional offset cancellation circuitry typically adds an impedance load to the buffer inputs/outputs. However, at step 704, if a offset cancellation is desired, then method 700 proceeds to step 708.

At step 708, method 700 determines which signal to apply offset cancellation. For example, switch 120 may be set to apply offset cancellation to either output 106 or 108. In one embodiment, the choice is programmably made by a PLD which selects to which output 106 or 108 to apply offset cancellation signal 142. In one embodiment, this choice may be predetermined during a design phase, manufacturing phase, testing phase, etc., for a given buffer circuit. For example, during a testing phase, a given lot of dies may require that an offset cancellation signal be applied to output 106 to cancel signal offsets associated with that particular lot of dies.

At step 710, the magnitude of the offset signal is established. In one embodiment, one or more of a plurality offset values are employed to adjust the magnitude of the offset signal to meet the needs of a given system. For example, consider a case where to meet a signal offset tolerance for a desired offset voltage of an output signal, a current amount is required that is two times a current value of $I_{offset}$. Method 700 sets the current amount to two times the current value of $I_{offset}$ to generate the desired voltage offset of the output signal.

At step 712, the offset signal is coupled to either the designated output signal. For example, offset signal 142 may be coupled to either output 106 or output 108. In one embodiment, the same signals used to determine the magnitude of the offset cancellation may be used to choose which output to offset. This is advantageous, as it allows for simplified programming. Method 700 ends at step 714.

The present invention thus provides various techniques for offset cancellation that is enabled by programmable logic. While the above provides a detailed description of various embodiments of the invention, many alternatives, modifications, and equivalents are possible. Therefore the scope of this invention should not be limited by the specific embodiments described above, and should instead be determined with reference to the appended claims along with their full scope of equivalents.

What is claimed is:

1. A method of correcting signal offsets for signals, the method comprising:
    determining whether a correction of a first offset or a second offset is required using signal select logic;
    coupling, using a switching circuit, an offset signal to a first signal output of a circuit requiring offset cancellation, but not to a second signal output of the circuit requiring offset cancellation, when a correction of the first offset is required;
    coupling, using the switching circuit, the offset signal to the second signal output, but not to the first signal output, when a correction of the second offset is required; and
    applying, using offset signal control logic, the offset signal either to the first or second signal output, thereby correcting the required offset to be within a predetermined tolerance.

2. The method of claim 1, wherein the coupling comprises coupling a programmable current source to the first or second signal output.

3. The method of claim 1, wherein the applying comprises selectively connecting a common set of current sources to the first or second signal output.

4. The method of claim 1, further comprising:
    decoupling the offset signal from either the first or second offsets when the correction is no longer required.

\* \* \* \* \*